US 12,301,270 B2

(12) United States Patent
Kani et al.

(10) Patent No.: US 12,301,270 B2
(45) Date of Patent: *May 13, 2025

(54) RADIO-FREQUENCY FRONT-END CIRCUIT AND COMMUNICATION APPARATUS

(71) Applicant: Murata Manufacturing Co., Ltd., Kyoto (JP)

(72) Inventors: Hiroyuki Kani, Kyoto (JP); Tomohiro Sano, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/595,989

(22) Filed: Mar. 5, 2024

(65) Prior Publication Data

US 2024/0204814 A1    Jun. 20, 2024

Related U.S. Application Data

(63) Continuation of application No. 18/311,426, filed on May 3, 2023, now Pat. No. 12,074,624, which is a (Continued)

(30) Foreign Application Priority Data

Jan. 23, 2019  (JP) ................... 2019-009819

(51) Int. Cl.
*H04B 1/04* (2006.01)
*H04B 1/00* (2006.01)
*H04B 1/16* (2006.01)

(52) U.S. Cl.
CPC ........... *H04B 1/1615* (2013.01); *H04B 1/006* (2013.01); *H04B 1/04* (2013.01); *H04B 2001/0408* (2013.01)

(58) Field of Classification Search
None
See application file for complete search history.

(56) References Cited

U.S. PATENT DOCUMENTS 9,172,411 B2    10/2015  Granger-Jones et al.
9,240,811 B2 *   1/2016  Norholm .................. H04B 1/56
(Continued)

FOREIGN PATENT DOCUMENTS

EP    3 116 124 A2    1/2017
JP    2006-129023 A    5/2006
(Continued)

OTHER PUBLICATIONS

International Search Report issued in Application No. PCT/JP2020/001664, dated Mar. 3, 2020.
(Continued)

*Primary Examiner* — Pablo N Tran
(74) *Attorney, Agent, or Firm* — McDonald Hopkins LLC

(57) ABSTRACT

In simultaneous communication using multiple frequency bands, the degradation in the communication quality is suppressed. The radio-frequency front-end circuit (1) includes an antenna terminal (2), a transmit filter (3), a receive filter, a transport filter, a switch (6), and a phase adjusting circuit (7). The switch (6) is capable of connecting the antenna terminal (2) to the transmit filter (3) or the receive filter and the transport filter simultaneously. The transmit filter (3) is disposed on a transmission path (T1). The receive filter is disposed on a reception path. The transport filter is disposed on a transport path. The phase adjusting circuit (7) is disposed on at least one of paths, the transmission path (T1), the reception path, and a reception/transmission path.

20 Claims, 8 Drawing Sheets

Related U.S. Application Data continuation of application No. 17/380,400, filed on Jul. 20, 2021, now Pat. No. 11,677,427, which is a continuation of application No. PCT/JP2020/001664, filed on Jan. 20, 2020.

(56) References Cited

U.S. PATENT DOCUMENTS

| | | | |
|---|---|---|---|
| 9,288,031 | B2 | 3/2016 | Rousu et al. |
| 9,780,756 | B2 * | 10/2017 | Maxim ................... H03F 1/565 |
| 10,257,119 | B2 | 4/2019 | Wloczysiak et al. |
| 10,277,259 | B2 * | 4/2019 | Ellá ....................... H04L 5/1461 |
| 10,284,244 | B1 | 5/2019 | Kulkarni et al. |
| 10,587,329 | B2 | 3/2020 | Maldonado et al. |
| 10,673,484 | B2 | 6/2020 | See et al. |
| 10,854,945 | B2 | 12/2020 | Zhu et al. |
| 10,911,073 | B2 * | 2/2021 | Schmidhammer ..... H04B 1/006 |
| 11,038,543 | B2 | 6/2021 | Chang et al. |
| 11,563,696 | B2 | 1/2023 | Wloczysiak et al. |
| 2007/0123175 | A1 | 5/2007 | Watanabe et al. |
| 2014/0227982 | A1 | 8/2014 | Granger-Jones et al. |
| 2014/0295775 | A1 | 10/2014 | Rousu et al. |
| 2014/0329475 | A1 | 11/2014 | Ella et al. |
| 2015/0133067 | A1 | 5/2015 | Chang et al. |
| 2016/0134414 | A1 | 5/2016 | Pehlke |
| 2016/0380652 | A1 | 12/2016 | Anthony et al. |
| 2017/0012597 | A1 | 1/2017 | Piipponen et al. |
| 2017/0062897 | A1 * | 3/2017 | Chance ................... H04B 1/52 |
| 2017/0317710 | A1 | 11/2017 | Liu et al. |
| 2017/0373368 | A1 | 12/2017 | Srirattana et al. |
| 2018/0063031 | A1 | 3/2018 | Wloczysiak et al. |
| 2018/0123549 | A1 | 5/2018 | Takeuchi |
| 2018/0123620 | A1 | 5/2018 | Ueno |
| 2018/0294858 | A1 | 10/2018 | Pehlke |
| 2018/0331714 | A1 | 11/2018 | See et al. |
| 2019/0028064 | A1 * | 1/2019 | Lee ....................... H03G 3/3042 |
| 2019/0097715 | A1 | 3/2019 | Maldonado et al. |
| 2019/0181890 | A1 | 6/2019 | Schmidhammer et al. |
| 2019/0222326 | A1 | 7/2019 | Dunworth et al. |
| 2020/0314820 | A1 * | 10/2020 | Kim ....................... H04L 5/0058 |
| 2021/0218424 | A1 | 7/2021 | Pehlke |
| 2022/0200560 | A1 * | 6/2022 | Azizi ........................ H01P 1/18 |
| 2022/0247441 | A1 | 8/2022 | Cho et al. |
| 2023/0144780 | A1 | 5/2023 | Pehlke |

FOREIGN PATENT DOCUMENTS

| | | |
|---|---|---|
| JP | 2012-169804 A | 9/2012 |
| JP | 2014-526847 A | 10/2014 |
| JP | 2017-017691 A | 1/2017 |
| WO | 2006/057173 A1 | 6/2006 |
| WO | 2017/006866 A1 | 1/2017 |
| WO | 2017/006867 A1 | 1/2017 |
| WO | 2018/031163 A1 | 2/2018 |

OTHER PUBLICATIONS

Written Opinion issued in Application No. PCT/JP2020/001664, dated Mar. 3, 2020.

CMCC, "TR 36.847 v2.0.0 on LTE Time Division Duplex (TDD)—Frequency Division Duplex (FDD) joint operation including Carrier Aggregation, for approval", 3GPP TSG-RAN WG #62, RP-131778, Dec. 6, 2013; Busan, Korea.

* cited by examiner

RADIO-FREQUENCY FRONT-END CIRCUIT AND COMMUNICATION APPARATUS

CROSS REFERENCE TO RELATED APPLICATIONS

This is a continuation of U.S. application Ser. No. 18/311,426 filed on May 3, 2023, which is a continuation of U.S. application Ser. No. 17/380,400 filed on Jul. 20, 2021, which is a continuation of International Application No. PCT/JP2020/001664 filed on Jan. 20, 2020, which claims priority from Japanese Patent Application No. 2019-009819 filed on Jan. 23, 2019. The contents of these applications are incorporated herein by reference in their entireties.

BACKGROUND OF THE DISCLOSURE

Field of the Disclosure

The present disclosure relates generally to a radio-frequency front-end circuit and a communication apparatus, and, more specifically, to a radio-frequency front-end circuit, which is capable of supporting simultaneous use of multiple communications different from each other, and a communication apparatus including the radio-frequency front-end circuit.

Description of the Related Art

In the related art, a known radio-frequency front-end circuit is capable of supporting simultaneous use of multiple communications different from each other (for example, see Patent Document 1).

A radio-frequency front-end circuit described in Patent Document 1 uses carrier aggregation (CA), in which signals in multiple frequency bands are received/transmitted simultaneously, to carry out FDD (Frequency Division Duplex) communication and TDD (Time Division Duplex) communication simultaneously. The radio-frequency front-end circuit described in Patent Document 1 aggregates multiple carriers or channels.

Patent Document 1: U.S. Patent Application Publication No. 2018/0294858

BRIEF SUMMARY OF THE DISCLOSURE

In transmission, the strength of transmit signals is high. Thus, noise of transmit signals themselves causes a problem, which needs a filter attenuating noise by a large amount. In contrast, in reception, the strength of receive signals is lower than that of transmit signals. Thus, the attenuation amount is not necessarily large. Therefore, it is preferable to make the attenuation amount of a filter in transmission different from that in reception.

However, in the radio-frequency front-end circuit described in Patent Document 1, transmit signals and receive signals are in the same frequency band. Thus, the same filter is used in transmission and reception. This causes a problem, for reception, of occurrence of degradation in loss due to excessive attenuation, the amount of which is determined for transmission. In contrast, for transmission, it is necessary to take into account matching a low noise amplifier (LNA) for reception. This causes a problem of failure to achieve low impedance suitable for matching a power amplifier (PA) for transmission.

To solve the problems described above, a transmit filter and a receive filter, which are separate from each other, may be used. That is, a transmission path and a reception path, which are separate from each other, may be used. In this case, a switch is used to switch the connection destination of an antenna between the transmission path and the reception path.

For example, in simultaneous communication using the signals (the transmit signals, the receive signals) and signals in a different frequency band, while the switch maintains continuous connection through the signal path for signals in the different frequency band, the switch needs to switch between the transmission path for transmit signals and the reception path for receive signals. At that time, the phase of signals in the different frequency band changes between in transmission of transmit signals and in reception of receive signals. That is, the phase of signals in the different frequency band in transmission of transmit signals is different from that in reception of receive signals. Thus, EVM (Error Vector Magnitude) in communication in the different frequency band may degrade at the times of switching between transmission of transmit signals and reception of receive signals, resulting in the degradation in the communication quality.

The present disclosure is made to view the point described above. An object of the present disclosure is to provide a radio-frequency front-end circuit and a communication apparatus which suppress the degradation in the communication quality in simultaneous communication using multiple frequency bands.

A radio-frequency front-end circuit according to an aspect of the present disclosure includes an antenna terminal, an input terminal, an output terminal, a communication terminal, a transmit filter, a receive filter, a transport filter, a switch, and a phase adjusting circuit. The transmit filter passes a first transmit signal transmitted through the antenna terminal by using TDD. The receive filter passes a first receive signal received through the antenna terminal by using TDD. The transport filter passes a communication signal which is a second transmit signal or a second receive signal and which is transported through the antenna terminal by using FDD. The switch is capable of connecting the antenna terminal to the transmit filter or the receive filter and the transport filter simultaneously. The phase adjusting circuit is a circuit for adjusting a phase. The switch includes a common terminal connectable to the antenna terminal electrically, a first selection terminal connectable to the transmit filter electrically, a second selection terminal connectable to the receive filter electrically, and a third selection terminal connectable to the transport filter electrically. The transmit filter is disposed on a transmission path. The transmission path connects the input terminal to the first selection terminal, and is a path for transmitting the first transmit signal. The receive filter is disposed on a reception path. The reception path connects the output terminal to the second selection terminal, and is a path for receiving the first receive signal. The transport filter is disposed on a transport path. The transport path connects the communication terminal to the third selection terminal, and is a path for transporting the communication signal. The phase adjusting circuit is disposed on at least one of the paths, the transmission path, the reception path, and the transport path.

A radio-frequency front-end circuit according to an aspect of the present disclosure includes an antenna terminal, an input terminal, an output terminal, a communication terminal, a transmit filter, a receive filter, a transport filter, a switch, and a phase adjusting circuit. The transmit filter passes a first transmit signal transmitted through the antenna terminal based on a first standard which is the 4G standard or the 5G standard. The receive filter passes a first receive signal received through the antenna terminal based on the first standard. The transport filter passes a communication signal which is a second transmit signal or a second receive signal and which is transported through the antenna terminal based on a second standard which is the 4G standard or the 5G standard. The switch is capable of connecting the antenna terminal to the transmit filter or the receive filter and the transport filter simultaneously. The phase adjusting circuit is a circuit for adjusting a phase. The switch includes a common terminal connectable to the antenna terminal electrically, a first selection terminal connectable to the transmit filter electrically, a second selection terminal connectable to the receive filter electrically, and a third selection terminal connectable to the transport filter electrically. The transmit filter is disposed on a transmission path. The transmission path connects the input terminal to the first selection terminal, and is a path for transmitting the first transmit signal. The receive filter is disposed on a reception path. The reception path connects the output terminal to the second selection terminal, and is a path for receiving the first receive signal. The transport filter is disposed on a transport path. The transport path connects the communication terminal to the third selection terminal, and is a path for transporting the communication signal. The phase adjusting circuit is disposed on at least one of the paths, the transmission path, the reception path, and the transport path.

A communication apparatus according to an aspect of the present disclosure includes the radio-frequency front-end circuit and a signal processing circuit. The signal processing circuit processes the first transmit signal, the first receive signal, and the communication signal.

The radio-frequency front-end circuit and the communication apparatus according to the aspects of the present disclosure may suppress the degradation in the communication quality in simultaneous communication using multiple frequency bands.

DETAILED DESCRIPTION OF THE DISCLOSURE

Figure 1:
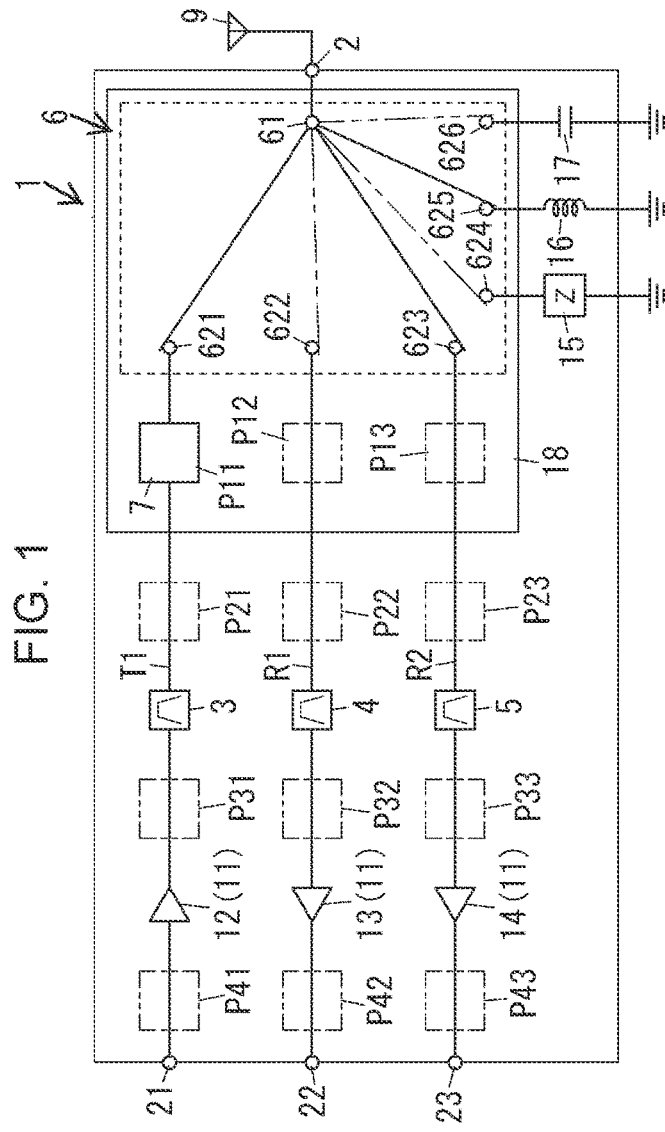
FIG. 1 is a diagram illustrating a schematic configuration of a radio-frequency front-end circuit according to an embodiment.

A radio-frequency front-end circuit and a communication apparatus according to an embodiment will be described below by referring to the drawings. The drawings referred to in the embodiment and the like are schematic. The ratios, in size or thickness, of the components in the figures do not necessarily reflect the actual dimensional ratios.

Embodiment

(1) A Radio-Frequency Front-End Circuit

The overall configuration of a radio-frequency front-end circuit 1 according to an embodiment will be described by referring to FIG. 1.

As illustrated in FIG. 1, the radio-frequency front-end circuit 1 according to the present embodiment includes an antenna terminal 2, a transmit filter 3, a first receive filter 4 (receive filter), a second receive filter 5 (transport filter), a switch 6, and a phase adjusting circuit 7. The radio-frequency front-end circuit 1 also includes, as amplifiers 11 for amplifying signals, a power amplifier 12, a first low noise amplifier (LNA) 13, and a second low noise amplifier 14. Further, the radio-frequency front-end circuit 1 includes a reactance circuit 15, an inductor 16, and a capacitor 17. In addition, the radio-frequency front-end circuit 1 includes an input terminal 21, an output terminal 22, and a communication terminal 23.

In the present embodiment, the radio-frequency front-end circuit 1 supports simultaneous use of TDD (Time Division Duplex) signals and FDD (Frequency Division Duplex) signals.

Figure 2:
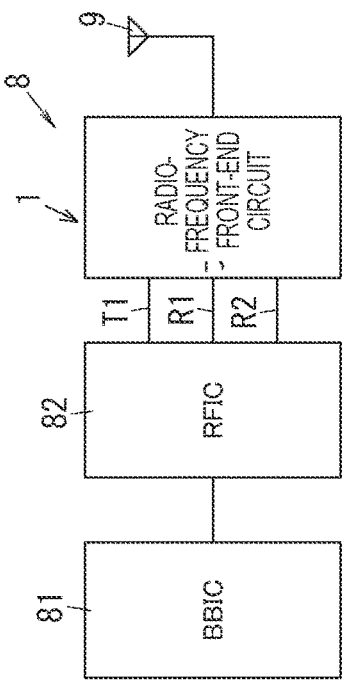
FIG. 2 is a diagram illustrating a schematic configuration of a communication apparatus according to an embodiment.
Figure 3A:
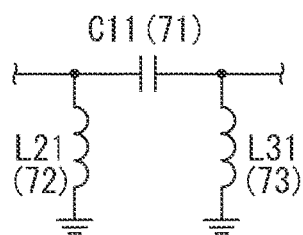
FIGS. 3A to 3D are circuit diagrams illustrating types of phase adjusting circuit used in the radio-frequency front-end circuit.
Figure 3B:
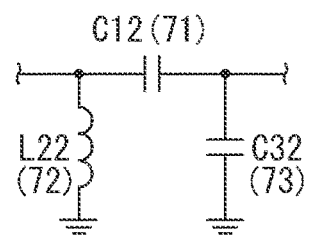
Figure 3C:
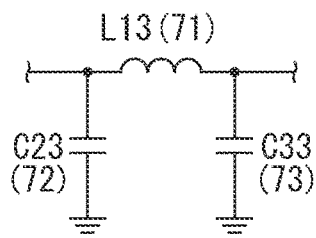
Figure 3D:
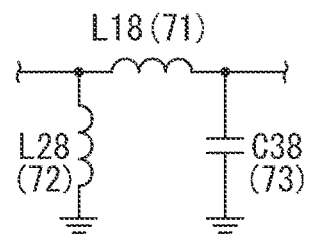
Figure 4A:
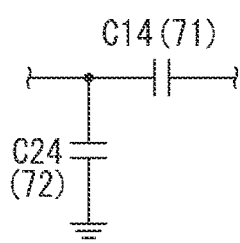
FIGS. 4A to 4D are circuit diagrams of types of phase adjusting circuit used in the radio-frequency front-end circuit.
Figure 4B:
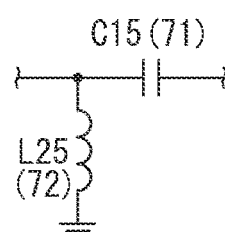
Figure 4C:
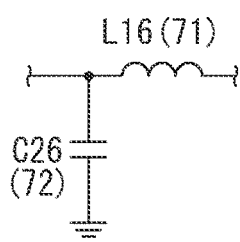
Figure 4D:
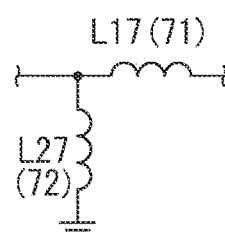

The radio-frequency front-end circuit 1 is used, for example, in a cellular phone such as a smartphone. The radio-frequency front-end circuit 1 is not limited to use in a cellular phone, and may be used, for example, in a wearable terminal such as a smartwatch. In short, as illustrated in FIG. 2, the radio-frequency front-end circuit 1 is used in a communication apparatus 8 which communicates with an external apparatus (not illustrated).

(2) The Components of the Radio-Frequency Front-End Circuit

The components of the radio-frequency front-end circuit 1 according to the present embodiment will be described by referring to the drawings.

(2.1) The Antenna Terminal, the Input Terminal, the Output Terminal, and the Communication Terminal As illustrated in FIG. 1, the antenna terminal 2 is electrically connected to an antenna 9 described below. The input terminal 21, the output terminal 22, and the communication terminal 23 are connected to an RF signal processing circuit 82 described below. The input terminal 21 is a terminal through which radio frequency signals (transmit signals) from external circuits are inputted to the radio-frequency front-end circuit 1. The output terminal 22 is a terminal through which radio frequency signals (receive signals) from the first low noise amplifier 13 are outputted to external circuits. The communication terminal 23 is a terminal through which radio frequency signals (receive signals) from the second low noise amplifier 14 are outputted to external circuits.

(2.2) The Transmit Filter

As illustrated in FIG. 1, the transmit filter 3 is disposed on a transmission path T1 for transmitting first transmit signals to the antenna 9 by using TDD. The transmission path T1 connects the input terminal 21 to a selection terminal 621 described below. The transmission path T1 is a path for transmitting first transmit signals through the antenna terminal 2 by using TDD. The transmit filter 3 passes first transmit signals in a first communication band (first frequency band). The first communication band is, for example, Band41 (2496 MHz-2690 MHz) according to the LTE (Long Term Evolution) standard (including the LTE-Advanced standard). The transmit filter 3 passes first transmit signals transmitted through the antenna terminal 2 by using TDD.

(2.3) The First Receive Filter

As illustrated in FIG. 1, the first receive filter 4 is disposed on a first reception path R1 (reception path) for receiving first receive signals from the antenna 9 by using TDD. The first reception path R1 connects the output terminal 22 to a selection terminal 622 described below. The first reception path R1 is a path for receiving first receive signals through the antenna terminal 2 by using TDD. The first receive filter 4 passes first receive signals in the first communication band (first frequency band). The first communication band of first receive signals is similar to the first communication band of first transmit signals. The first receive filter 4 passes first receive signals received through the antenna terminal 2 by using TDD.

(2.4) The Second Receive Filter

As illustrated in FIG. 1, the second receive filter 5 is disposed on a second reception path R2 (transport path) for receiving second receive signals (communication signals) from the antenna 9 by using FDD. The second reception path R2 connects the communication terminal 23 to a selection terminal 623 described below. The second reception path R2 is a path for transporting second receive signals through the antenna terminal 2 by using FDD. The second receive filter 5 passes second receive signals in a second communication band (second frequency band). The second communication band is, for example, Band3 (receive band: 1805 MHz-1880 MHz) of the LTE standard (including the LTE-Advanced standard). The second receive filter 5 passes second receive signals transported through the antenna terminal 2 by using FDD.

When the second receive filter 5 passes second transmit signals by using FDD, that is, the second receive filter 5 may be used for a second transmission path through which second transmit signals in the second communication band are transported through the antenna terminal 2. In this case, the second communication band is, for example, Band3 (transmit band: 1710 MHz-1785 MHz) of the LTE standard (including the LTE-Advanced standard). The second communication band may be, instead of Band3, Band25 (receive band: 1930 MHz-1995 MHz) of the LTE standard (including the LTE-Advanced standard).

(2.5) The Switch

As illustrated in FIG. 1, the switch 6 includes a common terminal 61 and multiple selection terminals 621 to 626 (in the illustrated example, six terminals). The switch 6 selects at least one of the selection terminals 621 to 623 as a communication destination of the common terminal 61. That is, the switch 6 connects the antenna 9 to the transmit filter 3, the first receive filter 4, and the second receive filter 5 selectively.

The common terminal 61 is connected to the antenna terminal 2. That is, the common terminal 61 is electrically connected to the antenna 9 through the antenna terminal 2. Direct connection of the common terminal 61 to the antenna 9 is not limiting. For example, a filter or a coupler may be disposed between the common terminal 61 and the antenna 9.

The selection terminal 621 (first selection terminal) is electrically connected to the transmit filter 3. The selection terminal 622 (second selection terminal) is electrically connected to the first receive filter 4. The selection terminal 623 (third selection terminal) is electrically connected to the second receive filter 5. The selection terminal 624 is electrically connected to the reactance circuit 15. The selection terminal 625 is electrically connected to the inductor 16. The selection terminal 626 is electrically connected to the capacitor 17.

While the switch 6 electrically connects the second receive filter 5 to the antenna 9, the switch 6 switches a connection destination of the antenna 9 between the transmit filter 3 and the first receive filter 4. In other words, while the switch 6 electrically connects the second receive filter 5 to the antenna terminal 2, the switch 6 switches a connection destination of the antenna terminal 2 between the transmit filter 3 and the first receive filter 4. In other words, the switch 6 is a switch capable of connecting the antenna terminal 2 to the transmit filter 3 or the first receive filter 4 and the second receive filter 5 simultaneously.

In the case of communication using only TDD signals, the switch 6 switches between the transmit filter 3 and the first receive filter 4 to establish an electrical connection with the antenna 9. Specifically, in the case of communication using only TDD signals, the switch 6 connects the selection terminal 621 and the selection terminal 622 to the common terminal 61.

In the case of communication using only FDD signals, the switch 6 electrically connects the second receive filter 5 to the antenna 9. Specifically, in the case of communication using only FDD signals, the switch 6 connects the selection terminal 623 to the common terminal 61.

In the case of carrier aggregation of simultaneous communication using TDD signals and FDD signals, the switch 6 maintains continuous connection between the second receive filter 5 and the antenna 9. The switch 6 switches between the transmit filter 3 and the first receive filter 4 alternately in accordance with time so as to establish an electrical connection with the antenna 9. Specifically, in the case of carrier aggregation, while the switch 6 maintains continuous connection between the selection terminal 623 and the common terminal 61, the switch 6 switches between the selection terminal 621 and the selection terminal 622 alternately to establish a connection to the common terminal 61. In transmit time periods, the switch 6 electrically connects the transmit filter 3 to the antenna 9. In receive time periods, the switch 6 electrically connects the first receive filter 4 to the antenna 9. Transmit time periods and receive time periods are allocated alternately over time. The carrier aggregation indicates communication with simultaneous use of radio waves in multiple frequency bands.

(2.6) The Phase Adjusting Circuit

As illustrated in FIG. 1, the phase adjusting circuit 7 is disposed on at least one of the paths, the transmission path T1, the first reception path R1, and the second reception path R2.

The position, in the circuit, of the phase adjusting circuit 7 will be described by referring to FIG. 1.

As a first example, the phase adjusting circuit 7 is disposed between the switch 6 and at least one of the filters, the transmit filter 3, the first receive filter 4, and the second receive filter 5. In the first example, the phase adjusting circuit 7 and the switch 6 form a switching module 18. That is, the phase adjusting circuit 7 is integrated with the switch 6. Specifically, the phase adjusting circuit 7 is positioned at one or more positions from P11 to P13 (in the illustrated example, three positions) in FIG. 1.

In the first example, the phase adjusting circuit 7 and the switch 6 form the switching module 18. This achieves a reduction in size compared with the case in which the phase adjusting circuit 7 is separate from the switch 6.

As a second example, the phase adjusting circuit 7 may be disposed between the switch 6 and at least one of the filters, the transmit filter 3, the first receive filter 4, and the second receive filter 5. In the second example, the phase adjusting circuit 7 is separate from the switch 6. Specifically, the phase adjusting circuit 7 is positioned at one or more positions from P21 to P23 (in the illustrated example, three positions) in FIG. 1.

In the second example, the phase adjusting circuit 7 is separate from the switch 6. This facilitates the formation of a circuit, as the phase adjusting circuit 7, having a large amount of reactance.

As a third example, the phase adjusting circuit 7 may be disposed between amplifiers 11 and at least one of the filters, the transmit filter 3, the first receive filter 4, and the second receive filter 5. Specifically, the phase adjusting circuit 7 is positioned at one or more positions from P31 to P33 (in the illustrated example, three positions) in FIG. 1.

In the third example, the phase adjusting circuit 7 is disposed between amplifiers 11 and at least one of the filters, the transmit filter 3, the first receive filter 4, and the second receive filter 5. This enables individual optimization for each of the transmission path T1, the first reception path R1, and the second reception path R2, achieving improvement of insertion loss in the other paths.

As a fourth example, the phase adjusting circuit 7 is disposed on the opposite side of at least one of the filters, the transmit filter 3, the first receive filter 4, and the second receive filter 5, relative to the amplifiers 11 on at least one of the paths, the transmission path T1, the first reception path R1, and the second reception path R2. That is, the phase adjusting circuit 7 is disposed between the filters (the transmit filter 3, the first receive filter 4, the second receive filter 5) and the RF signal processing circuit 82 (see FIG. 2) described below. Specifically, the phase adjusting circuit 7 is positioned at one or more positions from P41 to P43 (in the illustrated example, three positions) in FIG. 1.

In the fourth example, the phase adjusting circuit 7 is disposed at the opposite side of at least one of the filters, the transmit filter 3, the first receive filter 4, and the second receive filter 5, relative to the amplifiers 11 on at least one of the paths, the transmission path T1, first reception path R1, and the second reception path R2. This enables improvement of the noise figure (NF).

In the example in FIG. 1, the phase adjusting circuit 7 is positioned at the position P11. This position is not limiting. In particular, the phase adjusting circuit 7 is preferably positioned at any one of the positions P11 to P13 and P43.

The radio-frequency front-end circuit 1 may include two or more phase adjusting circuits 7. In this case, the two or more phase adjusting circuits 7 are positioned at two or more of the positions P11 to P13, P21 to P23, P31 to P33, and P41 to P43.

When importance is placed on the transmission characteristics of transmit signals passing through the transmission path T1, the phase adjusting circuit 7 is preferably disposed on either or both of the first reception path R1 and the second reception path R2. That is, the phase adjusting circuit 7 is preferably positioned at one or more positions selected from P12, P13, P22, P23, P32, P33, P42, and P43.

In contrast, when importance is placed on the reception characteristics of first receive signals passing through the first reception path R1, the phase adjusting circuit 7 is preferably disposed on either or both of the transmission path T1 and the second reception path R2. That is, the phase adjusting circuit 7 is preferably positioned at one or more positions selected from P11, P13, P21, P23, P31, P33, P41, and P43. When importance is placed on the reception characteristics of second receive signals passing through the second reception path R2, the phase adjusting circuit 7 is preferably disposed on either or both of the transmission path T1 and the first reception path R1. That is, the phase adjusting circuit 7 is preferably positioned at one or more positions selected from P11, P12, P21, P22, P31, P32, P41, and P42.

The circuit configuration of the phase adjusting circuit 7 will be described by referring to FIGS. 3A to 3D, 4A to 4D, and 5.

As illustrated in FIGS. 3A to 3D, 4A to 4D, and 5, the phase adjusting circuit 7 includes a first reactance device 71 and a second reactance device 72. The first reactance device 71 is inserted in series to the path. The second reactance device 72 is disposed between a first end of the first reactance device 71 and the ground.

The phase adjusting circuit 7 illustrated in FIGS. 3A to 3D includes a third reactance device 73 in addition to the first reactance device 71 and the second reactance device 72. The third reactance device 73 is disposed between a second end of the first reactance device 71 and the ground. That is, the phase adjusting circuit 7 illustrated in FIGS. 3A to 3D is a π-type circuit. The phase adjusting circuit 7 illustrated in FIG. 3A includes a capacitor C11 serving as the first reactance device 71, an inductor L21 serving as the second reactance device 72, and an inductor L31 serving as the third reactance device 73. The phase adjusting circuit 7 illustrated in FIG. 3B includes a capacitor C12 serving as the first reactance device 71, an inductor L22 serving as the second reactance device 72, and a capacitor C32 serving as the third reactance device 73. The phase adjusting circuit 7 illustrated in FIG. 3C includes an inductor L13 serving as the first reactance device 71, a capacitor C23 serving as the second reactance device 72, and a capacitor C33 serving as the third reactance device 73. The phase adjusting circuit 7 illustrated in FIG. 3D includes an inductor L18 serving as the first reactance device 71, an inductor L28 serving as the second reactance device 72, and a capacitor C38 serving as the third reactance device 73.

The phase adjusting circuit 7 illustrated in FIGS. 4A to 4D includes the first reactance device 71 and the second reactance device 72. The phase adjusting circuit 7 illustrated in FIG. 4A includes a capacitor C14 serving as the first reactance device 71 and a capacitor C24 serving as the second reactance device 72. The phase adjusting circuit 7 illustrated in FIG. 4B includes a capacitor C15 serving as the first reactance device 71 and an inductor L25 serving as the second reactance device 72. The phase adjusting circuit 7 illustrated in FIG. 4C includes an inductor L16 serving as the first reactance device 71 and a capacitor C26 serving as the second reactance device 72. The phase adjusting circuit 7 illustrated in FIG. 4D includes an inductor L17 serving as the first reactance device 71 and an inductor L27 serving as the second reactance device 72.

Figure 5:
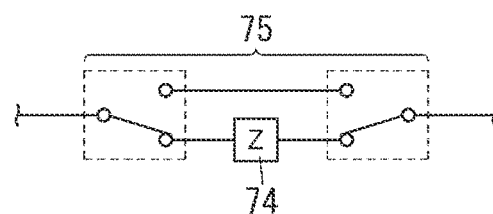
FIG. 5 is a circuit diagram of a phase adjusting circuit used in the radio-frequency front-end circuit.

As illustrated in FIG. 5, the phase adjusting circuit 7 may further include a switching unit 75 switching between a path which goes through a reactance circuit 74 and a path which does not go through the reactance circuit 74. The reactance circuit 74 is formed of at least one of the devices, the first reactance device 71, the second reactance device 72, and the third reactance device 73. In other words, the reactance circuit 74 may be formed of any one of the devices, the first reactance device 71, the second reactance device 72, and the third reactance device 73. Alternatively, the reactance circuit 74 may be formed of any two of the devices, the first reactance device 71, the second reactance device 72, and the third reactance device 73. Alternatively, the reactance circuit 74 may be formed of the first reactance device 71, the second reactance device 72, and the third reactance device 73. Also, in the reactance circuit 74, each of the first reactance device 71, the second reactance device 72, and the third reactance device 73 is a capacitor or an inductor.

The reactance of each of the first reactance device 71, the second reactance device 72, and the third reactance device 73 may be variable.

When, as in the first example, the phase adjusting circuit 7 is included in the switching module 18, the phase adjusting circuit 7 is more preferably formed of capacitors than the case in which the phase adjusting circuit 7 is formed of a combination of capacitors and inductors. That is, when the phase adjusting circuit 7 is positioned at the positions P11 to P13 in FIG. 1, the phase adjusting circuit 7 is preferably formed of capacitors.

When, as in the second example, the phase adjusting circuit 7 is separate from the switch 6, the phase adjusting circuit 7 is more preferably formed of a combination of capacitors and inductors than in the case in which the phase adjusting circuit 7 is formed of capacitors. That is, when the phase adjusting circuit 7 is positioned at the positions P21 to P23 in FIG. 1, the phase adjusting circuit 7 is preferably formed of a combination of capacitors and inductors. This achieves greater freedom of design of the reactance of the phase adjusting circuit 7.

When, as in the fourth example, the phase adjusting circuit 7 is disposed between the filters (the transmit filter 3, the first receive filter 4, the second receive filter 5) and the RF signal processing circuit 82 (see FIG. 2), the phase adjusting circuit 7 may be separate from the filters. That is, the phase adjusting circuit 7, the filters, and the like do not necessarily form a module.

When the phase adjusting circuit 7 is disposed on the second reception path R2 which is a reception path for FDD, the phase adjusting circuit 7 preferably includes a variable reactance circuit whose reactance is variable.

The phase adjusting circuit 7 may include only one reactance device. The phase adjusting circuit 7 may include, for example, only a variable capacitor inserted in series to the path. In this case, adjustment of the capacitance of the variable capacitor enables a desired phase to be obtained.

The phase adjusting circuit 7 may be part of a transmission line. In this case, setting of the length and pattern of the transmission line constituting the phase adjusting circuit 7 causes a desired phase.

(3) Operations of the Radio-Frequency Front-End Circuit

Operations of the radio-frequency front-end circuit 1 according to the present embodiment will be described below by referring to FIG. 1.

The case of communication using only TDD signals will be described. In this case, the switch 6 selects the selection terminal 621 and the selection terminal 622 as connection destinations of the common terminal 61. That is, the antenna 9 is electrically connected to the transmit filter 3 and the first receive filter 4. The radio-frequency front-end circuit 1 outputs transmit signals to the antenna 9 through the phase adjusting circuit 7 and the switch 6 or through the switch 6. The transmit signals are emitted as wireless signals from the antenna 9. In contrast, receive signals received by the antenna 9 are inputted to the first receive filter 4 through the switch 6 and the phase adjusting circuit 7 or through the switch 6.

The case of communication using only FDD signals will be described. In this case, the switch 6 selects the selection terminal 623 as a connection destination of the common terminal 61. That is, the antenna 9 is electrically connected to the second receive filter 5. Receive signals received by the antenna 9 are inputted to the second receive filter 5 through the switch 6 and the phase adjusting circuit 7 or through the switch 6.

The case of carrier aggregation of simultaneous communication using TDD signals and FDD signals will be described. In this case, the switch 6 selects the selection terminal 623 and the selection terminal 621 or the selection terminal 622 as connection destinations of the common terminal 61. While continuous connection between the antenna 9 and the second receive filter 5 is maintained, the antenna 9 is connected to the transmit filter 3 and the first receive filter 4 alternately.

FDD receive signals received by the antenna 9 are outputted to the RF signal processing circuit 82 (see FIG. 2), which is described below, through the second receive filter 5 and the phase adjusting circuit 7 or through the second receive filter 5 on the second reception path R2 which is a reception path for FDD. TDD transmit signals are outputted to the antenna 9 through the transmit filter 3 and the phase adjusting circuit 7 or through the transmit filter 3 on the transmission path T1 which is a transmission path for TDD. TDD receive signals are outputted to the RF signal processing circuit 82 through the first receive filter 4 and the phase adjusting circuit 7 or through the first receive filter 4 on the first reception path R1 which is a reception path for TDD.

(4) The Relationship Between the Phase Difference and a Characteristic

The relationship between the phase difference and the bit error rate in the radio-frequency front-end circuit 1 according to the present embodiment will be described by referring to the drawings. The phase difference herein is a phase difference between FDD receive signals in simultaneous connection of the transmission path T1 and the second reception path R2, and FDD receive signals in simultaneous connection of the first reception path R1 and the second reception path R2.

A small phase difference is preferable. Thus, as described above, the radio-frequency front-end circuit 1 uses the phase adjusting circuit 7 to adjust the phase so that the phase difference is made small. The bit error rates in the case of a phase difference of 30°, in the case of a phase difference of 10°, in the case of a phase difference of 4°, and in the case of a phase difference of 1° will be described.

Figure 6A:
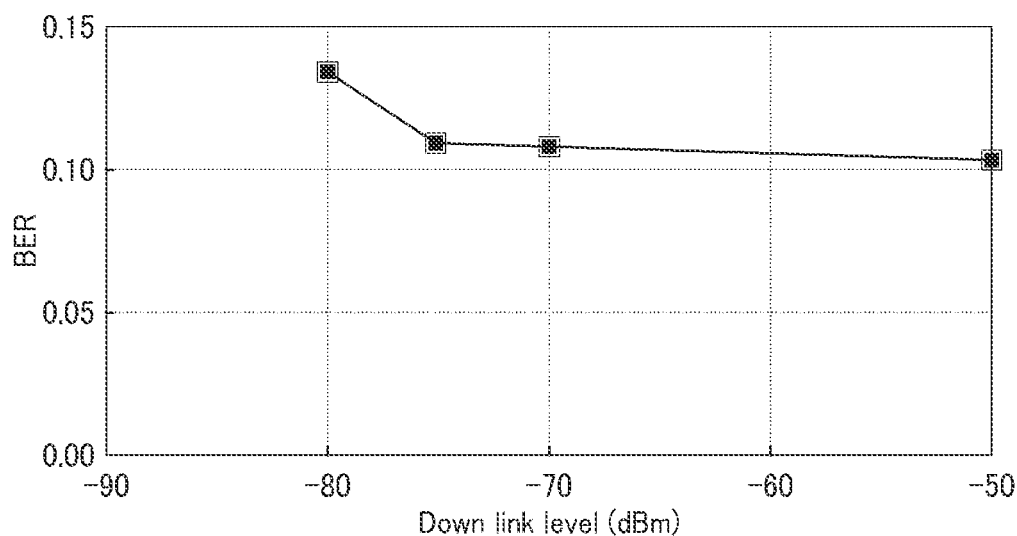
FIG. 6A is a graph illustrating the bit error rate before error correction in the case of a phase difference of 30° in the radio-frequency front-end circuit.
Figure 6B:
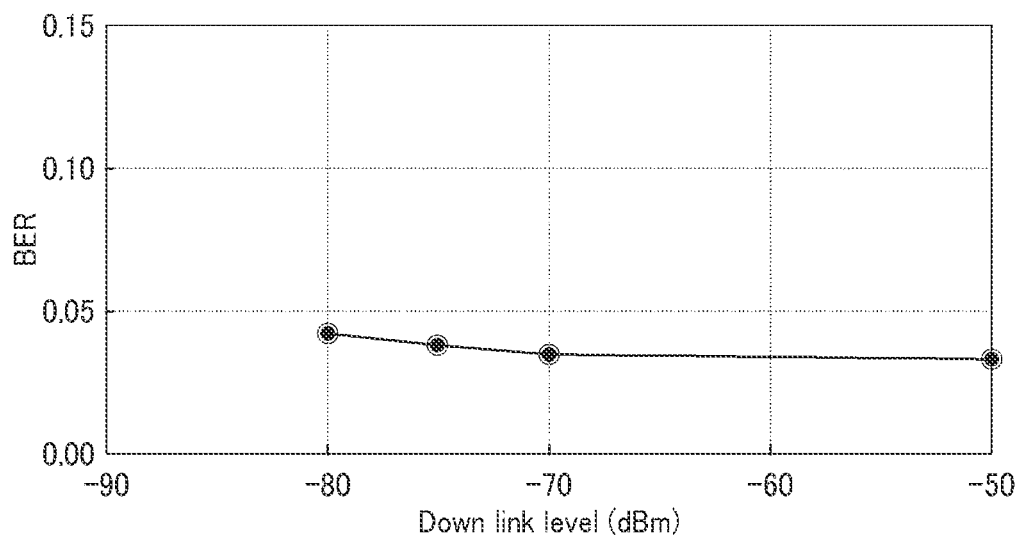
FIG. 6B is a graph illustrating the bit error rate after error correction in the case of a phase difference of 30° in the radio-frequency front-end circuit.

In the case of a phase difference of 30°, as illustrated in FIG. 6A, the bit error rate before error correction is equal to or greater than 0.1. As illustrated in FIG. 6B, the bit error rate after error correction is also equal to or greater than 0.03.

Figure 7A:
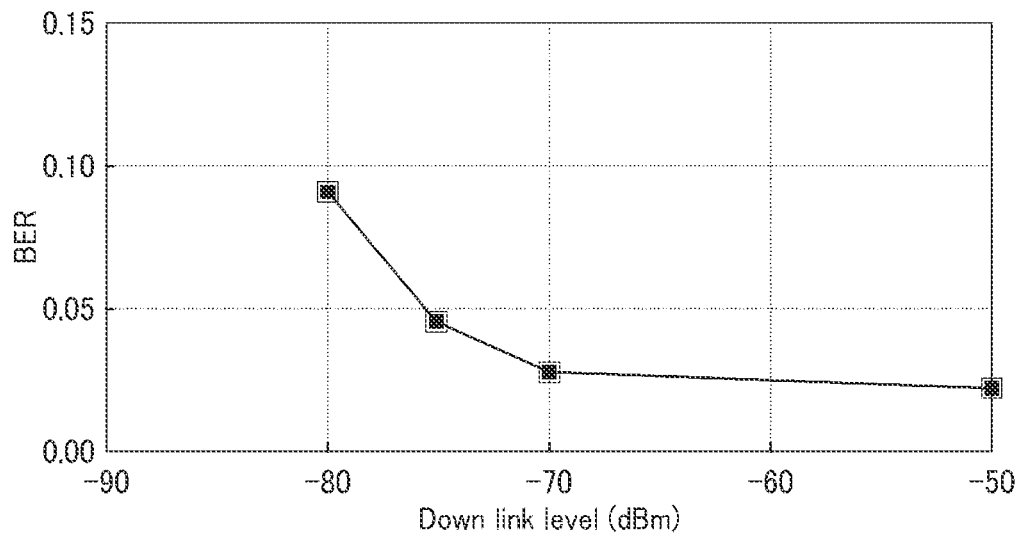
FIG. 7A is a graph illustrating the bit error rate before error correction in the case of a phase difference of 10° in the radio-frequency front-end circuit.
Figure 7B:
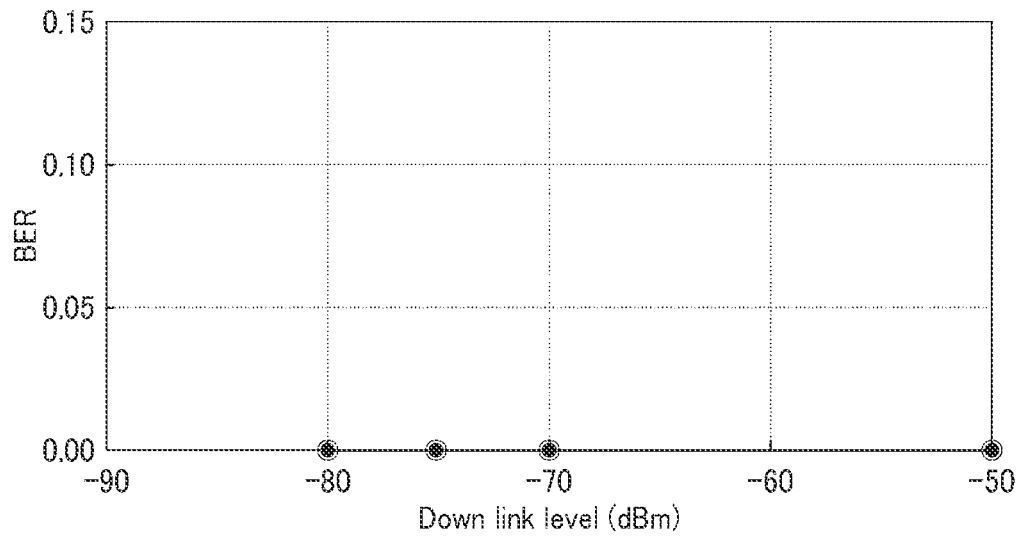
FIG. 7B is a graph illustrating the bit error rate after error correction in the case of a phase difference of 10° in the radio-frequency front-end circuit.

In contrast, in the case of a phase difference of 10°, as illustrated in FIG. 7A, the bit error rate before error correction is smaller than that in the case of a phase difference of 30°, but is not small enough. However, as illustrated in FIG. 7B, unlike the case of a phase difference of 30°, the bit error rate after error correction is small enough.

Figure 8A:
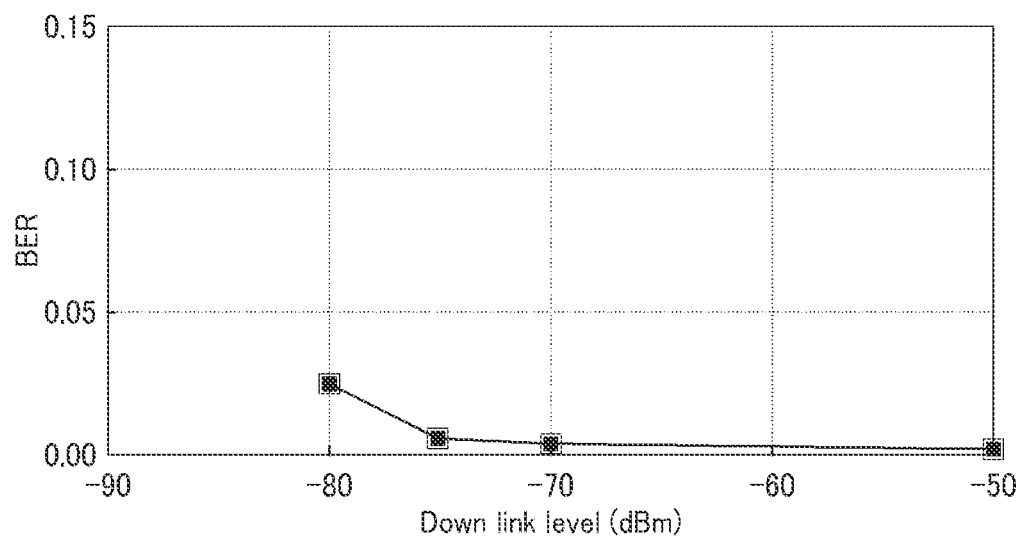
FIG. 8A is a graph illustrating the bit error rate before error correction in the case of a phase difference of 4° in the radio-frequency front-end circuit.
Figure 8B:
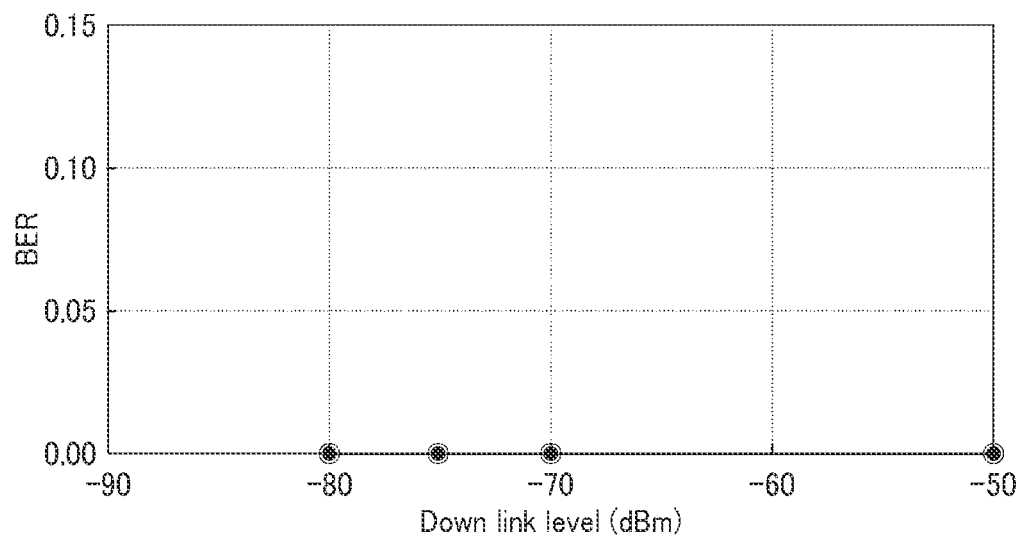
FIG. 8B is a graph illustrating the bit error rate after error correction in the case of a phase difference of 4° in the radio-frequency front-end circuit.

In the case of a phase difference of 4°, as illustrated in FIG. 8A, the bit error rate before error correction is smaller than that in the case of a phase difference of 10°. As illustrated in FIG. 8B, like the case of a phase difference of 10°, the bit error rate after error correction is small enough.

Figure 9A:
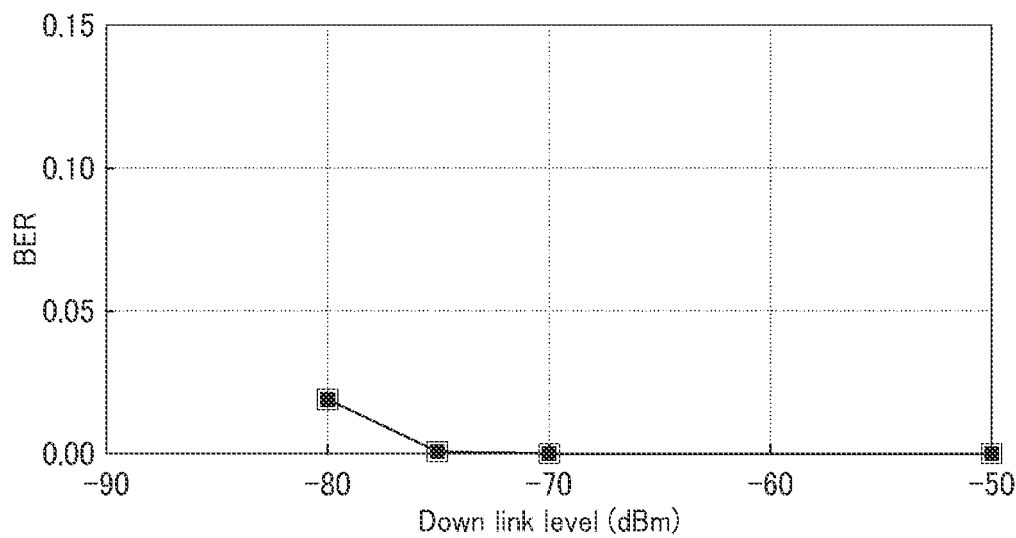
FIG. 9A is a graph illustrating the bit error rate before error correction in the case of a phase difference of 1° in the radio-frequency front-end circuit.
Figure 9B:
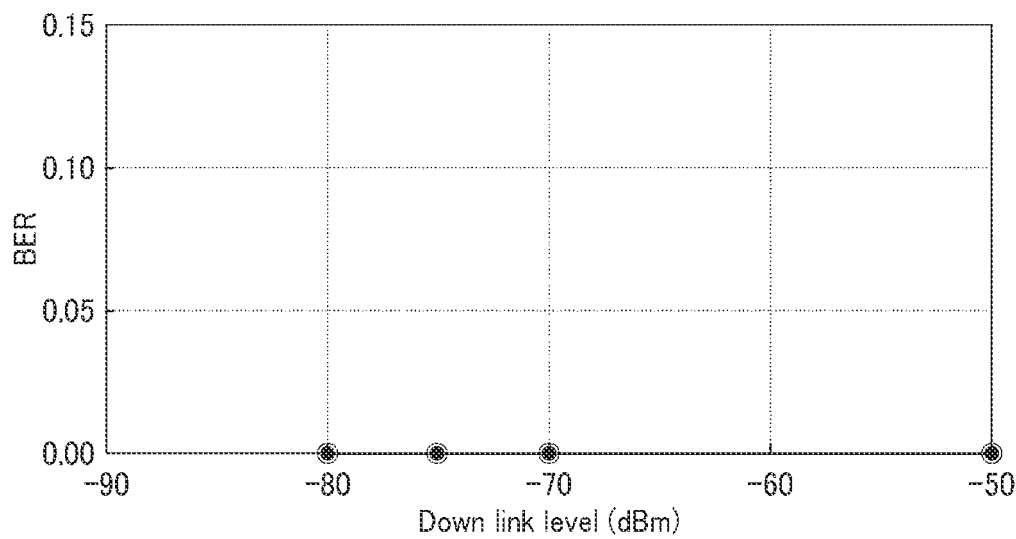
FIG. 9B is a graph illustrating the bit error rate after error correction in the case of a phase difference of 1° in the radio-frequency front-end circuit.

In the case of a phase difference of 1°, as illustrated in FIG. 9A, the bit error rate before error correction is small enough. Therefore, as illustrated in FIG. 9B, the bit error rate after error correction is also small enough.

Error correction is made in actual use. Thus, a phase difference is acceptable if its bit error rate, which is large before error correction, is made small enough after error correction.

As described above, in the case of a phase difference of 10° or less, the bit error rate after error correction is made small, causing a good characteristic to be obtained.

(5) The Communication Apparatus

As illustrated in FIG. 2, the communication apparatus 8 includes the radio-frequency front-end circuit 1, a baseband signal processing circuit 81, and the RF signal processing circuit 82. The baseband signal processing circuit 81 and the RF signal processing circuit 82 form a signal processing circuit which processes transmit signals, first receive signals, and second receive signals.

(5.1) The Baseband Signal Processing Circuit

As illustrated in FIG. 2, the baseband signal processing circuit 81 is, for example, a BBIC (Baseband Integrated Circuit), and is electrically connected to the RF signal processing circuit 82. The baseband signal processing circuit 81 generates an I-phase signal and a Q-phase signal from a baseband signal. The baseband signal processing circuit 81 combines the I-phase signal with the Q-phase signal to perform IQ modulation, and outputs a transmit signal. At that time, the transmit signal is generated as a modulated signal obtained by performing amplitude modulation on a carrier signal, having a given frequency, with a period longer than that of the carrier signal.

(5.2) The RF Signal Processing Circuit

As illustrated in FIG. 2, the RF signal processing circuit 82 is, for example, an RFIC (Radio Frequency Integrated Circuit), and is disposed between the radio-frequency front-end circuit 1 and the baseband signal processing circuit 81. The RF signal processing circuit 82 has a function of signal processing on transmit signals from the baseband signal processing circuit 81, and a function of signal processing on receive signals received by the antenna 9. The RF signal processing circuit 82 supports multiband processing, and is capable of generating and amplifying transmit signals in multiple communication bands.

(6) Effects

When the radio-frequency front-end circuit 1 according to the present embodiment performs simultaneous communication using multiple frequency bands, that is, performs TDD transmission in communication of carrier aggregation using TDD signals and FDD signals, the phase adjusting circuit 7 is disposed on at least one of the paths, the transmission path T1, the first reception path R1, and the second reception path R2. This suppresses the degradation in the communication quality of the reception using FDD in communication of carrier aggregation using TDD signals and FDD signals.

(7) Modified Examples

Modified examples of the present embodiment will be described.

(7.1) First Modified Example

The radio-frequency front-end circuit 1 according to the present embodiment supports simultaneous use of TDD signals and FDD signals. As a first modified example of the present embodiment, the radio-frequency front-end circuit 1 may support simultaneous use (dual connectivity) of 4G signals and 5G signals.

The 4G system and the 5G system are different from each other. Therefore, in the case of dual connectivity of communication based on the 4G standard and communication based on the 5G standard, the TDD reception/transmission timing based on the 4G standard may not be synchronized with the TDD reception/transmission timing based on the 5G standard. That is, the TDD reception/transmission timing based on the 4G standard may be different from the TDD reception/transmission timing based on the 5G standard. Therefore, in communication based on a first standard which is one of the 4G standard and the 5G standard, when switching between transmission and reception is made, the phase may change in reception based on a second standard which is the other one of the 4G standard and the 5G standard.

Like the radio-frequency front-end circuit 1 according to the present embodiment, the radio-frequency front-end circuit 1 according to the present modified example includes the antenna terminal 2, the transmit filter 3, the first receive filter 4, the second receive filter 5, the switch 6, and the phase adjusting circuit 7.

In the present modified example, the transmit filter 3 is disposed on the transmission path for transmitting, to the antenna 9, transmit signals based on the first standard which is one of the 4G standard and the 5G standard, and passes transmit signals. The first receive filter 4 is disposed on the first reception path for receiving, from the antenna 9, first receive signals based on the first standard, and passes first receive signals. The second receive filter 5 is disposed on the second reception path for receiving, from the antenna 9, second receive signals based on the second standard which is the other one of the 4G standard and the 5G standard, and passes second receive signals.

Preferably, the first standard is the 5G standard, and the second standard is the 4G standard. In this case, the transmission path T1 illustrated in FIG. 1 is a path for transmitting, to the antenna 9, transmit signals based on the 5G standard. The first reception path R1 illustrated in FIG. 1 is a path for receiving, from the antenna 9, first receive signals based on the 5G standard. The second reception path R2 illustrated in FIG. 1 is a path for receiving, from the antenna 9, second receive signals based on the 4G standard.

In the present modified example, the transmit filter 3 passes transmit signals based on the 5G standard. The first receive filter 4 passes first receive signals based on the 5G standard. The second receive filter 5 passes second receive signals based on the 5G standard.

Also, in the present modified example, like the present embodiment, while the switch 6 electrically connects the second receive filter 5 to the antenna 9, the switch 6 switches a connection destination of the antenna 9 between the transmit filter 3 and the first receive filter 4.

Also, in the present modified example, like the present embodiment, the phase adjusting circuit 7 is disposed on at least one of the paths, the transmission path T1, the first reception path R1, and the second reception path R2.

In the radio-frequency front-end circuit 1 according to the present modified example, in the case of simultaneous communication using multiple frequency bands, that is, in the case of communication with simultaneous use of the first standard and the second standard, the phase adjusting circuit 7 is disposed on at least one of the paths, the transmission path T1 for the first standard, the first reception path R1 for the first standard, and the second reception path R2 for the second standard. This suppresses the degradation in the communication quality of the reception based on the second standard in communication with simultaneous use of the first standard and the second standard.

In the radio-frequency front-end circuit 1 according to the present modified example, the first standard is the 5G standard, and the second standard is the 4G standard. The requirement for the 5G standard is stricter than that for the 4G standard. Thus, a transmission filter and a different reception filter are used for the 5G standard. Thus, in communication with dual connectivity of the 4G standard and the 5G standard, while communication quality in transmission and reception based on the 5G standard is improved, the degradation in the communication quality of the reception based on the 4G standard may be suppressed.

The configuration of the radio-frequency front-end circuit 1 according to the present modified example is not limited to that in which the first standard is the 5G standard and the second standard is the 4G standard. The first standard may be the 4G standard, and the second standard may be the 5G standard. Alternatively, both the first standard and the second standard may be the 4G standard, or both the first standard and the second standard may be the 5G standard.

In the case where both the first standard and the second standard are the 5G standard, for example, the first communication band is n41 (2496 MHz-2690 MHz) of the 5G standard, and the second communication band is n40 (2300 MHz-2400 MHz) of the 5G standard. Thus, in communication based on the 5G standard with simultaneous use of two TDD communications, the degradation in the communication quality may be suppressed. Alternatively, the first communication band may be n41 of the 5G standard, and the second communication band may be n1 (transmit band: 1920 MHz-1980 MHz, receive band: 2110 MHz-2170 MHz), n3 (transmit band: 1710 MHz-1785 MHz, receive band: 1805 MHz-1880 MHz), or n75 (receive band: 1432 MHz-1517 MHz) of the 5G standard. Thus, in communication based on the 5G standard with simultaneous use of TDD communication and FDD communication, the degradation in the communication quality may be suppressed. n1, n3, and n75 used in simultaneous communication with n41 in the 5G standard are exemplary. A frequency band used in simultaneous communication with n41 in the 5G standard may be different from the frequency bands (n1, n3, n75).

In addition, second receive signals may be transported by using TDD so as to be asynchronous to first transmit signals and first receive signals. That is, first transmit signals and first receive signals may be also transported by using TDD, and second receive signals may be also transported by using TDD. When both the first standard and the second standard are the 4G standard, for example, the first communication band may be Band41, and the second communication band may be Band40 (2300 MHz-2400 MHz). Thus, in communication with simultaneous use of two TDD communications, the degradation in the communication quality may be suppressed.

(7.2) Second Modified Example

Figure 10:
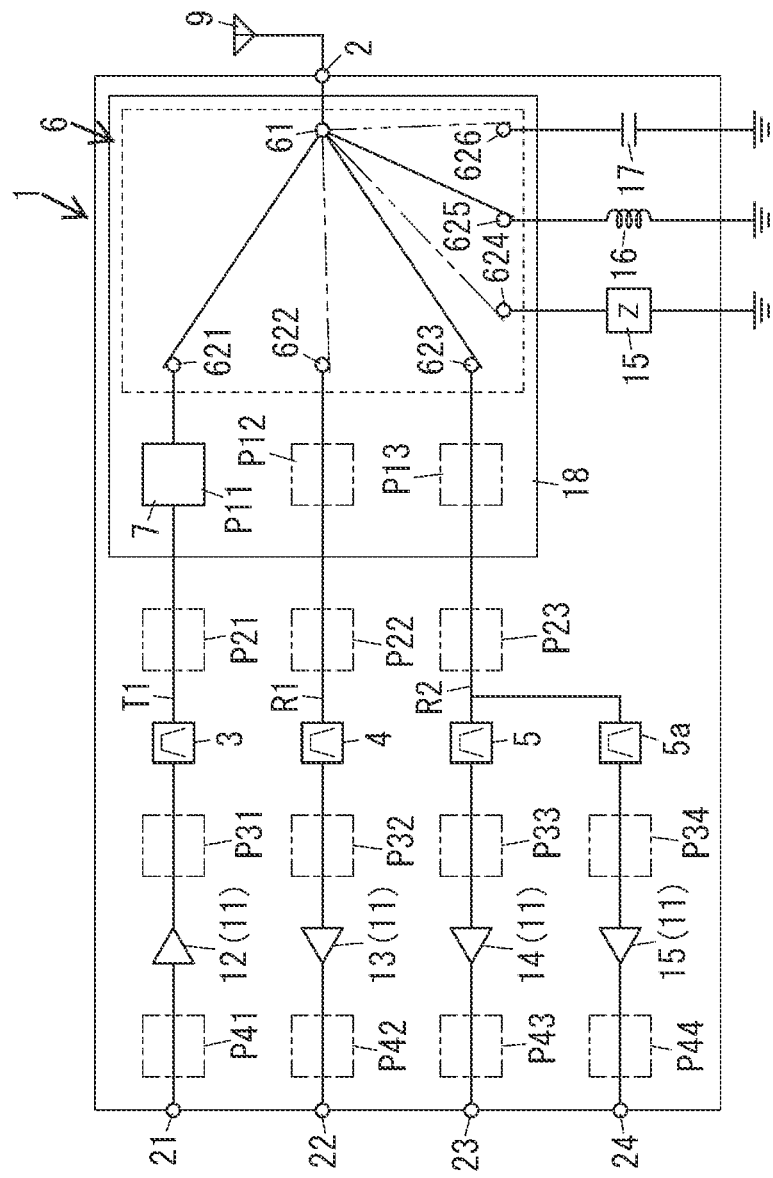
FIG. 10 is a diagram illustrating a schematic configuration of a radio-frequency front-end circuit according to a second modified example of an embodiment.

As a second modified example of the present embodiment, as illustrated in FIG. 10, the radio-frequency front-end circuit 1 may include multiple second receive filters 5 and 5a (in the illustrated example, two filters) as transport filters. For example, in the case of FDD, FDD may be provided with multiple bands instead of a single band. In this case, the phase adjusting circuit 7 may be disposed at each of the position P43 and a position P44, achieving individual adjustment of the phase.

(7.3) Third Modified Example

Figure 11:
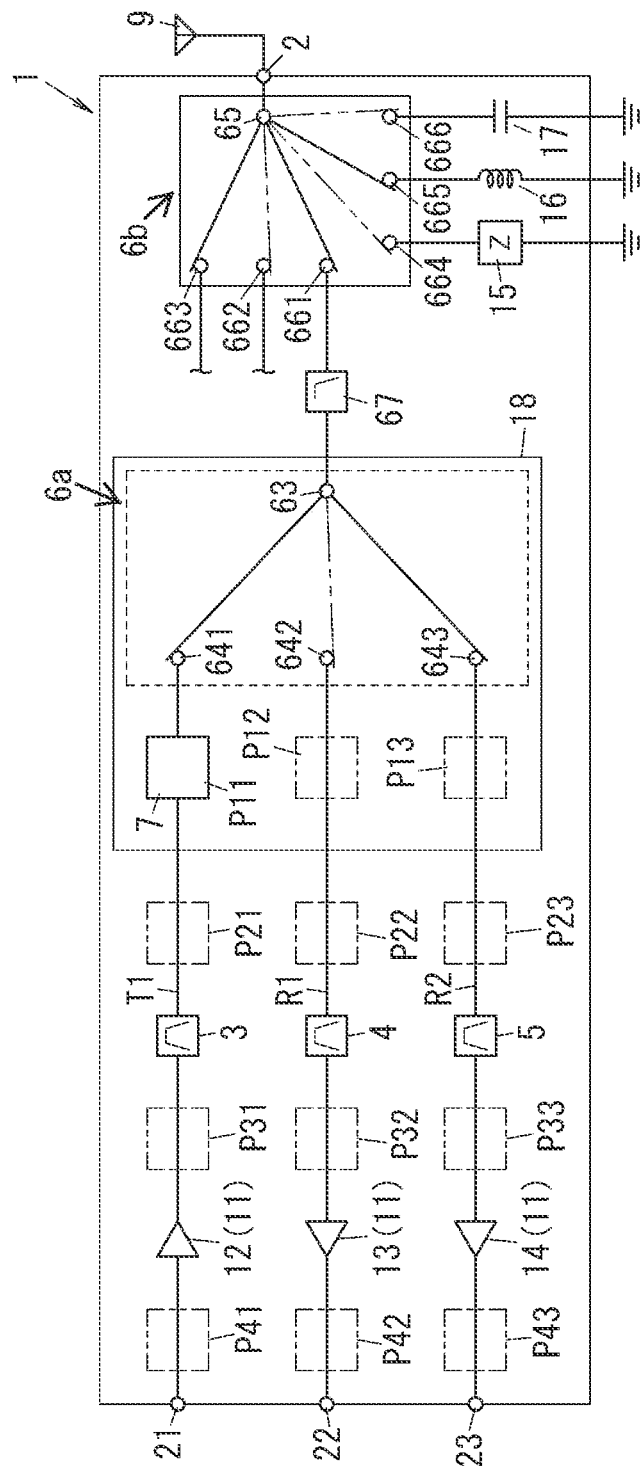
FIG. 11 is a diagram illustrating a schematic configuration of a radio-frequency front-end circuit according to a third modified example of an embodiment.

As a third modified example of the present embodiment, as illustrated in FIG. 11, the radio-frequency front-end circuit 1 may include multiple switches 6a and 6b (in the illustrated example, two switches) instead of the switch 6 (see FIG. 1).

As illustrated in FIG. 11, the switch 6a includes a common terminal 63 and multiple selection terminals 641 to 643 (in the illustrated example, three terminals). The switch 6a selects at least one of the selection terminals 641 to 643 as a connection destination of the common terminal 63. That is, the switch 6a connects the common terminal 63 to the transmit filter 3, the first receive filter 4, and the second receive filter 5 selectively.

The common terminal 63 is connected to the switch 6b through a filter 67. That is, the common terminal 63 is electrically connected to the antenna 9 through the switch 6b.

The selection terminal 641 (first selection terminal) is electrically connected to the transmit filter 3. The selection terminal 642 (second selection terminal) is electrically connected to the first receive filter 4. The selection terminal 643 (third selection terminal) is electrically connected to the second receive filter 5.

While the switch 6a electrically connects the second receive filter 5 to the common terminal 63, the switch 6a switches a connection destination of the common terminal 63 between the transmit filter 3 and the first receive filter 4. In other words, while the switch 6a electrically connects the second receive filter 5 to the antenna terminal 2, the switch 6a switches a connection destination of the antenna terminal 2 between the transmit filter 3 and the first receive filter 4.

As illustrated in FIG. 11, the switch 6b includes a common terminal 65 and multiple selection terminals 661 to 666 (in the illustrated example, six terminals). The switch 6b selects at least one of the selection terminals 661 to 663 as a connection destination of the common terminal 65.

The common terminal 65 is connected to the antenna terminal 2. That is, the common terminal 65 is electrically connected to the antenna 9 through the antenna terminal 2. Direct connection of the common terminal 65 to the antenna 9 is not limiting.

The selection terminal 661 is electrically connected to the filter 67. The selection terminal 661 is electrically connected to the common terminal 63 of the switch 6a through the filter 67. The selection terminals 662 and 663 are electrically connected to other filters (not illustrated). The selection terminal 664 is electrically connected to the reactance circuit 15. The selection terminal 665 is electrically connected to the inductor 16. The selection terminal 666 is electrically connected to the capacitor 17.

(7.4) A Different Modified Example

As a different modified example of the present embodiment, the phase adjusting circuit 7 may be integrated with the RF signal processing circuit 82. That is, the RF signal processing circuit 82 may be formed of a single chip in which the phase adjusting circuit 7 is integrated.

The radio-frequency front-end circuit 1 and the communication apparatus 8 according to the modified examples exert effects similar to those of the radio-frequency front-end circuit 1 and the communication apparatus 8 according to the present embodiment.

The embodiment and modified examples described above are merely some of various embodiments and modified examples of the present disclosure. Various modifications on the embodiment and modified examples may be made in accordance with design or the like as long as the object of the present disclosure is achieved.

(Aspects)

According to the embodiment and modified examples described above, the following aspects are disclosed.

A radio-frequency front-end circuit (1) according to a first aspect includes an antenna terminal (2), an input terminal (21), an output terminal (22), a communication terminal (23), a transmit filter (3), a receive filter (the first receive filter 4), a transport filter (the second receive filter 5), a switch (6; 6a), and a phase adjusting circuit (7). The transmit filter (3) passes a first transmit signal transmitted through the antenna terminal (2) by using TDD. The receive filter passes a first receive signal received through the antenna terminal (2) by using TDD. The transport filter passes a communication signal which is a second transmit signal or a second receive signal and which is transported through the antenna terminal (2) by using FDD. The switch (6; 6a) is capable of connecting the antenna terminal (2) to the transmit filter (3) or the receive filter and the transport filter simultaneously. The phase adjusting circuit (7) is a circuit for adjusting a phase. The switch (6; 6a) includes a common terminal (61; 63) connectable to the antenna terminal (2) electrically, a first selection terminal (the selection terminal 621; 641) connectable to the transmit filter (3) electrically, a second selection terminal (the selection terminal 622; 642) connectable to the receive filter electrically, and a third selection terminal (the selection terminal 623; 643) connectable to the transport filter electrically. The transmit filter (3) is disposed on a transmission path (T1). The transmission path (T1) connects the input terminal (21) to the first selection terminal, and is a path for transmitting the first transmit signal. The receive filter is disposed on a reception path (the first reception path R1). The reception path connects the output terminal (22) to the second selection terminal, and is a path for receiving the first receive signal. The transport filter is disposed on a transport path (the second reception path R2). The transport path connects the communication terminal (23) to the third selection terminal, and is a path for transporting the communication signal. The phase adjusting circuit (7) is disposed on at least one of paths, the transmission path (T1), the reception path, and a reception/transmission path.

In simultaneous communication using multiple frequency bands, that is, in communication using carrier aggregation of TDD signals and FDD signals, the radio-frequency front-end circuit (1) according to the first aspect may suppress the degradation in the communication quality of the reception using FDD.

According to the radio-frequency front-end circuit (1) in a second aspect, in the first aspect, the first transmit signal and the first receive signal are signals in a first communication band. The communication signal is a signal in a second communication band different from the first communication band.

According to the radio-frequency front-end circuit (1) in a third aspect, in the second aspect, the first communication band is a communication band based on the 4G standard or the 5G standard. The second communication band is a communication band different from the first communication band, and a communication band based on the 4G standard or the 5G standard.

According to the radio-frequency front-end circuit (1) in a fourth aspect, in the third aspect, the first communication band is Band41. The second communication band is Band3.

A radio-frequency front-end circuit (1) according to a fifth aspect includes an antenna terminal (2), an input terminal (21), an output terminal (22), a communication terminal (23), a transmit filter (3), a receive filter (the first receive filter 4), a transport filter (the second receive filter 5), a switch (6; 6a), and a phase adjusting circuit (7). The transmit filter (3) passes a first transmit signal transmitted through the antenna terminal (2) based on a first standard which is the 4G standard or the 5G standard. The receive filter passes a first receive signal received through the antenna terminal (2) based on the first standard. The transport filter passes a communication signal (second receive signal) which is a second transmit signal or the second receive signal and which is transported through the antenna terminal (2) based on a second standard which is the 4G standard or the 5G standard. The switch (6; 6a) is capable of connecting the antenna terminal (2) to the transmit filter (3) or the receive filter and the transport filter simultaneously. The phase adjusting circuit (7) is a circuit for adjusting a phase. The switch (6; 6a) includes a common terminal (61; 63) connectable to the antenna terminal (2) electrically, a first selection terminal (the selection terminal 621; 641) connectable to the transmit filter (3) electrically, a second selection terminal (the selection terminal 622; 642) connectable to the receive filter electrically, and a third selection terminal (the selection terminal 623; 643) connectable to the transport filter electrically. The transmit filter (3) is disposed on a transmission path (T1). The transmission path (T1) connects the input terminal (21) to the first selection terminal, and is a path for transmitting the first transmit signal. The receive filter is disposed on a reception path (the first reception path R1). The reception path connects the output terminal (22) to the second selection terminal, and is a path for receiving the first receive signal. The transport filter is disposed on a transport path (the second reception path R2). The transport path connects the communication terminal (23) to the third selection terminal, and is a path for transporting the communication signal. The phase adjusting circuit (7) is disposed on at least one of paths, the transmission path (T1), the reception path, and a reception/transmission path.

In simultaneous communication using multiple frequency bands, that is, in communication with simultaneous use of the first standard and the second standard, the radio-frequency front-end circuit (1) according to the fifth aspect may suppress the degradation in the communication quality of the reception based on the second standard.

According to the radio-frequency front-end circuit (1) in a sixth aspect, in the fifth aspect, the first standard is the 5G standard, and the second standard is the 4G standard.

In communication with dual connectivity of the 4G standard and the 5G standard, while communication quality in transmission and reception based on the 5G standard is improved, the radio-frequency front-end circuit (1) according to the sixth aspect may suppress the degradation in the communication quality of the reception based on the 4G standard.

According to the radio-frequency front-end circuit (1) in a seventh aspect, in the fifth aspect, the first transmit signal and the first receive signal are transported by using TDD. The communication signal (the second transmit signal or the second receive signal) is transported by using TDD so as to be asynchronous to the first transmit signal and the first receive signal.

According to the radio-frequency front-end circuit (1) in an eighth aspect, in any one of the first to seventh aspects, the phase adjusting circuit (7) is disposed between the switch (6; 6a) and at least one of the filters, the transmit filter (3), the receive filter (the first receive filter 4), and the transport filter (the second receive filter 5). The phase adjusting circuit (7) and the switch (6; 6a) form a module.

The radio-frequency front-end circuit (1) according to the eighth aspect may be made smaller than that in the case in which the phase adjusting circuit (7) is separate from the switch (6; 6a).

According to the radio-frequency front-end circuit (1) in a ninth aspect, in any one of the first to seventh aspects, the phase adjusting circuit (7) is disposed between the switch (6; 6a) and at least one of the filters, the transmit filter (3), the receive filter (the first receive filter 4), and the transport filter (the second receive filter 5). The phase adjusting circuit (7) is separate from the switch (6; 6a).

The radio-frequency front-end circuit (1) according to the ninth aspect facilitates the formation of a circuit, having a large amount of reactance, as the phase adjusting circuit (7).

In any one of the first to seventh aspects, the radio-frequency front-end circuit (1) according to a tenth aspect further includes an amplifier (11). The amplifier (11) amplifies a signal. The phase adjusting circuit (7) is disposed between the amplifier (11) and at least one of the filters, the transmit filter (3), the receive filter (the first receive filter 4), and the transport filter (the second receive filter 5).

The radio-frequency front-end circuit (1) according to the tenth aspect may optimize the transmission path (T1), the reception path (the first reception path R1), and the reception/transmission path (the second reception path R2) individually, improving insertion loss of the other paths.

In any one of the first to seventh aspects, the radio-frequency front-end circuit (1) according to an eleventh aspect further includes an amplifier (11). The amplifier (11) amplifies a signal. The phase adjusting circuit (7) is disposed at one or more of positions between the amplifier (11) and the input terminal (21) on the transmission path (T1), between the amplifier (11) and the output terminal (22) on the reception path (the first reception path R1), and between the amplifier (11) and the communication terminal (23) in the transport path (the second reception path R2).

The radio-frequency front-end circuit (1) according to the eleventh aspect may improve the noise figure (NF).

According to the radio-frequency front-end circuit (1) in a twelfth aspect, in any one of the first to eleventh aspects, the phase adjusting circuit (7) includes at least one reactance device (the first reactance device 71; the second reactance device 72) which is inserted in series to the path or is inserted between the path and the ground.

According to the radio-frequency front-end circuit (1) in a thirteenth aspect, in the twelfth aspect, the phase adjusting circuit (7) includes a first reactance device (71) and a second reactance device (72) as the reactance device. The first reactance device (71) is inserted in series to the path. The second reactance device (72) is disposed between a first end of the first reactance device (71) and the ground.

According to the radio-frequency front-end circuit (1) in a fourteenth aspect, in the thirteenth aspect, the first reactance device (71) and the second reactance device (72) are capacitors (C14, C24).

According to the radio-frequency front-end circuit (1) in a fifteenth aspect, in the thirteenth aspect, the first reactance device (71) is a capacitor (C15), and the second reactance device (72) is an inductor (L25).

According to the radio-frequency front-end circuit (1) in a sixteenth aspect, in the thirteenth aspect, the first reactance device (71) is an inductor (L16), and the second reactance device (72) is a capacitor (C26).

According to the radio-frequency front-end circuit (1) in a seventeenth aspect, in the thirteenth aspect, the first reactance device (71) and the second reactance device (72) are inductors (L17, L27).

According to the radio-frequency front-end circuit (1) in an eighteenth aspect, in the twelfth or thirteenth aspect, the reactance device is a wiring portion constituting part of the path.

According to the radio-frequency front-end circuit (1) in a nineteenth aspect, in any one of the twelfth to eighteenth aspects, the reactance device (the first reactance device 71; the second reactance device 72) has a variable reactance.

According to the radio-frequency front-end circuit (1) in a twentieth aspect, in any one of the thirteenth to seventeenth aspects, the phase adjusting circuit (7) further includes a third reactance device (73). The third reactance device (73) is disposed between a second end of the first reactance device (71) and the ground.

According to the radio-frequency front-end circuit (1) in a twenty-first aspect, in any one of the thirteenth to seventeenth and twentieth aspects, the phase adjusting circuit (7) further includes a switching unit (75). The switching unit (75) switches between a first path and a second path. The first path goes through a reactance circuit (74) including either or both of the first reactance device (71) and the second reactance device (72). The second path does not go through the reactance circuit (74).

According to the radio-frequency front-end circuit (1) in a twenty-second aspect, in any one of the first to twenty-first aspects, the phase adjusting circuit (7) is a circuit for adjusting the phase so as to obtain a phase difference of 10° or less.

A communication apparatus (8) according to a twenty-third aspect includes the radio-frequency front-end circuit (1) according to any one of the first to twenty-second aspects, and a signal processing circuit (the baseband signal processing circuit 81, the RF signal processing circuit 82). The signal processing circuit processes the first transmit signal, the first receive signal, and the communication signal (the second receive signal).

The communication apparatus (8) according to the twenty-third aspect may cause the radio-frequency front-end circuit (1) to suppress the degradation in the communication quality in communication with simultaneous use of multiple communication systems different from each other.

1 radio-frequency front-end circuit
11 amplifier
12 power amplifier
13 first low noise amplifier
14 second low noise amplifier
15 reactance circuit
16 inductor
17 capacitor
18 switching module
2 antenna terminal
21 input terminal
22 output terminal
23 communication terminal
3 transmit filter
4 first receive filter (receive filter)
5, 5a second receive filter (transport filter)
6, 6a switch
61, 63 common terminal
621, 641 selection terminal (first selection terminal)
622, 642 selection terminal (second selection terminal)
623, 643 selection terminal (third selection terminal)
624 to 626 selection terminal
65 common terminal
661 to 666 selection terminal
67 filter
7 phase adjusting circuit
71 first reactance device
72 second reactance device
73 third reactance device
74 reactance circuit
75 switching unit
8 communication apparatus
81 baseband signal processing circuit (signal processing circuit)
82 RF signal processing circuit (signal processing circuit)
9 antenna
C11, C12, C14, C15, C23, C24, C26, C32, C33, C38 capacitor
L13, L16, L17, L18, L21, L22, L25, L27, L28, L31 inductor
T1 transmission path
R1 first reception path (reception path)
R2 second reception path (transport path)
P11 to P13, P21 to P23, P31 to P34, P41 to P44 position

The invention claimed is:

1. A radio-frequency front-end circuit comprising:
an antenna terminal;
a transmit filter configured to pass a transmit signal of a time division duplexing (TDD) band;
a receive filter configured to pass a receive signal of the TDD band;
a filter configured to pass a radio frequency signal of a frequency division duplexing (FDD) band; and
a switch configured to switch a connection between the antenna terminal and the transmit filter, a connection between the antenna terminal and the receive filter, and a connection between the antenna terminal and the filter, and to simultaneously connect the antenna terminal to the transmit filter and to the filter, and to simultaneously connect the antenna terminal to the receive filter and to the filter,
wherein a phase difference between a phase of the radio frequency signal of the FDD band in response to the switch simultaneously connecting the antenna terminal to the transmit filter and to the filter, and a phase of the radio frequency signal of the FDD band in response to the switch simultaneously connecting the antenna terminal to the receive filter and to the filter, is 10 degrees or less.

2. The radio-frequency front-end circuit according to claim 1, wherein the phase difference is 4 degree or less.

3. The radio-frequency front-end circuit according to claim 1,
wherein the phase difference is 1 degree or less.

4. The radio-frequency front-end circuit according to claim 1, further comprising:
an input terminal;
an output terminal;
a communication terminal; and
a phase circuit,
wherein the phase circuit is in series with a first signal transmission path that is between the antenna terminal and the input terminal, a second signal transmission path that is between the antenna terminal and the output terminal, or a third signal transmission path that is between the antenna terminal and the communication terminal, or
wherein the phase circuit is connected between ground and at least the first signal transmission path, the second signal transmission path, or the third signal transmission path.

5. The radio-frequency front-end circuit according to claim 4, wherein the phase circuit is between ground and the first signal transmission path between the switch and the transmit filter, between ground and the second signal transmission path between the switch and the receive filter, or between ground and the third signal transmission path between the switch and the filter.

6. The radio-frequency front-end circuit according to claim 5, wherein the phase circuit comprises an inductor.

7. The radio-frequency front-end circuit according to claim 6, wherein the TDD band is different than the FDD band.

8. The radio-frequency front-end circuit according to claim 6,
wherein the TDD band is a band of one of a fourth generation (4G) standard or a fifth generation (5G) standard, and
wherein the FDD band is a band of the other of the 4G standard or the 5G standard.

9. The radio-frequency front-end circuit according to claim 6,
wherein the TDD band is Band41, and
wherein the FDD band is Band3.

10. The radio-frequency front-end circuit according to claim 4, further comprising:
an amplifier in the first signal transmission path connected between the input terminal and the transmit filter,
wherein the phase circuit is between ground and the first signal transmission path between the amplifier and the transmit filter.

11. The radio-frequency front-end circuit according to claim 4, further comprising:

an amplifier in the first signal transmission path connected between the input terminal and the transmit filter, wherein the phase circuit is between ground and the first signal transmission path between the amplifier and the input terminal.

12. The radio-frequency front-end circuit according to claim 4, further comprising:

an amplifier in the second signal transmission path connected between the output terminal and the receive filter, wherein the phase circuit is between ground and the second signal transmission path between the amplifier and the receive filter.

13. The radio-frequency front-end circuit according to claim 4, further comprising:

an amplifier in the second signal transmission path connected between the output terminal and the receive filter, wherein the phase circuit is between ground and the second signal transmission path between the amplifier and the output terminal.

14. The radio-frequency front-end circuit according to claim 4, further comprising:

an amplifier in the third signal transmission path connected between the output terminal and the filter, wherein the phase circuit is between ground and the third signal transmission path between the amplifier and the filter.

15. The radio-frequency front-end circuit according to claim 4, further comprising:

an amplifier in the third signal transmission path connected between the output terminal and the filter, wherein the phase circuit is between ground and the third signal transmission path between the amplifier and the output terminal.

16. The radio-frequency front-end circuit according to claim 4, wherein the phase circuit is in the first signal transmission path between the switch and the transmit filter, the second signal transmission path between the switch and the receive filter, or the third signal transmission path between the switch and the filter.

17. The radio-frequency front-end circuit according to claim 16, further comprising:

an amplifier in the first signal transmission path connected between the input terminal and the transmit filter, wherein the phase circuit is in the first signal transmission path between the amplifier and the transmit filter.

18. The radio-frequency front-end circuit according to claim 4, further comprising:

an amplifier in the first signal transmission path connected between the input terminal and the transmit filter, wherein the phase circuit is in the first signal transmission path between the amplifier and the input terminal.

19. The radio-frequency front-end circuit according to claim 4, further comprising:

an amplifier in the second signal transmission path connected between the output terminal and the receive filter, wherein the phase circuit is in the second signal transmission path between the amplifier and the receive filter.

20. The radio-frequency front-end circuit according to claim 4, further comprising:

an amplifier in the second signal transmission path connected between the output terminal and the receive filter, wherein the phase circuit is in the second signal transmission path between the amplifier and the output terminal.

* * * * *